United States Patent [19]

Price, Jr.

[11] 4,158,782
[45] Jun. 19, 1979

[54] I²L INTERFACE WITH EXTERNAL INPUTS AND METHOD THEREOF

[75] Inventor: John J. Price, Jr., Mesa, Ariz.

[73] Assignee: Motorola, Inc., Schaumburg, Ill.

[21] Appl. No.: 826,229

[22] Filed: Aug. 22, 1977

[51] Int. Cl.² .................. H03K 19/08; H03K 19/20
[52] U.S. Cl. ................................ 307/213; 307/203; 307/299 B; 307/DIG. 1; 357/92
[58] Field of Search ............... 307/203, 213, 214, 207, 307/303, 299 B, DIG. 1, 264; 357/92

[56] References Cited
U.S. PATENT DOCUMENTS

| 3,735,151 | 5/1973 | Frederiksen | 307/299 B X |
| 3,755,693 | 8/1973 | Lee | 307/DIG. 1 X |
| 4,005,315 | 1/1977 | Blauschild | 307/299 B X |

OTHER PUBLICATIONS

Hart et al., "Bipolar LSI Takes a New Direction with I²L;" *Electronics*, (pub.); pp. 111–118; 10/3/74.
Robbins, "MTL-T²L Parallel Clock Powering;" *IBM Tech. Discl. Bull.*; vol. 19, No. 6, pp. 2075–2076; 11/1976.
Müller et al., "High-Speed I²L with Oxide Isolation;" *Siemens Forsch. u. Entwickl.-Ber. Bd.* 5, (1976), Nr. 6; pp. 360–363.
Hart et al., "Integrated Injection Logic: A New Approach to LSI;" *IEEE-JSSC*, vol. Sc-7, No. 5, pp. 346–351; 10/1972.

*Primary Examiner*—Larry N. Anagnos
*Attorney, Agent, or Firm*—Robert D. Lott; M. David Shapiro; Marvin A. Glazer

[57] ABSTRACT

Combining a differential PNP transistor pair for receiving external digital signals with an NPN output transistor in an I²L configuration connected to the output of the differential pair provides a simple, high-speed, and versatile digital logic to I²L interface circuit. The interface circuit is applicable to almost any digital logic series and also to analog inputs as they provide inputs into I²L circuitry.

8 Claims, 3 Drawing Figures

I²L INTERFACE WITH EXTERNAL INPUTS AND METHOD THEREOF

BACKGROUND OF THE INVENTION

This invention relates, in general, to digital logic interface circuits and, more particularly, to interface circuits from other types of logic families into integrated injection logic (I²L) circuitry, and methods of interfacing with I²L circuitry.

Integrated injection logic (I²L) offers many advantages over other types of logic for certain applications. However, other logic types have features which make them more desirable in other applications and often the two logic families will have to interact with one another. Since most logic families, including the common types such as T²L, and MOS logic, are not directly compatible with I²L circuitry, it is necessary to provide some sort of interface circuit.

In the past, the interface circuit has consisted of a series of transistor stages which voltage shift the output from a given circuit type to make it compatible with the I²L input requirements. Such circuitry is illustrated by C. M. Hart et al, in "Bipolar LSI Takes a New Direction With Integrated Injection Logic", Electronics, Oct. 3, 1974, at page 111. Specifically, FIG. 7 of Hart et al's article shows a four transistor interface circuit from a T²L to an I²L device. However, the interface circuits used in the past have had several drawbacks. For example, the several stages of transistors results in signal delays from the driving circuitry into the I²L circuitry. Moreover, these devices require a relatively large area on the semiconductor substrate. Also, each logic type driving the I²L such as T²L or CMOS or NMOS requires a separate type of interface circuit. Thus, in the past it has been generally impractical to build a universal interface circuit on a semiconductor substrate for accepting whichever type of interface a user would choose as an input to the I²L circuitry.

Therefore, it can be appreciated that a digital logic to I²L interface circuit which is simple, fast, and applicable to several different types of logic is highly desirable.

SUMMARY OF THE INVENTION

Accordingly, it is an object of this invention to provide a simple, two-stage interface circuit to couple signals from any of the various logic families into I²L circuitry.

It is also an object of this invention to provide an interface circuit from any of the various logic families into I²L circuitry which has a minimum amount of propogation delay.

It is still another object of this invention to provide an interface circuit which will be applicable in interfacing several different types of logic with I²L circuitry.

It is also an object of this invention to provide an interface from any of the various logic families to I²L circuitry which uses a minimum amount of power supply current.

Another object of this invention is to provide an interface circuit for I²L which allows a user a choice of either an inverting or non-inverting interface circuit.

It is also an object of this invention to provide an interface circuit in which the output signals from the interface circuit are centrally located physically within the I²L circuitry.

Yet a further object of this invention is to provide a method of interfacing from any of the various logic families to I²L logic which is simple, fast, and versatile.

In accordance with one embodiment of this invention, a differential transistor pair having a dual input is provided; the first input is provided for receiving a reference voltage; and the second input is provided for receiving an information carrying input signal. The output of the differential pair is coupled to the base of an NPN I²L transistor such that the NPN I²L transistor is either conducting or non-conducting in response to the input signal applied to the differential pair.

Also provided is a method for interfacing a standard logic family into I²L circuitry which comprises differentially sensing an input signal and comparing it to a reference signal and applying the results of this comparison to the base of a I²L NPN output transistor to thereby provide I²L compatible logic levels in response to the input signal.

DESCRIPTION OF THE PREFERRED EMBODIMENT

Figure 1:
FIG. 1 is a block diagram indicating the functional placement of the present invention.

Now referring to FIG. 1, any of a various group of digital logic families represented by block 10 which is to provide an input into I²L logic circuitry of block 12 must usually be processed through an interface circuit shown as block 14 in order to provide compatibility between the logic levels of the two families of logic.

Figure 2:
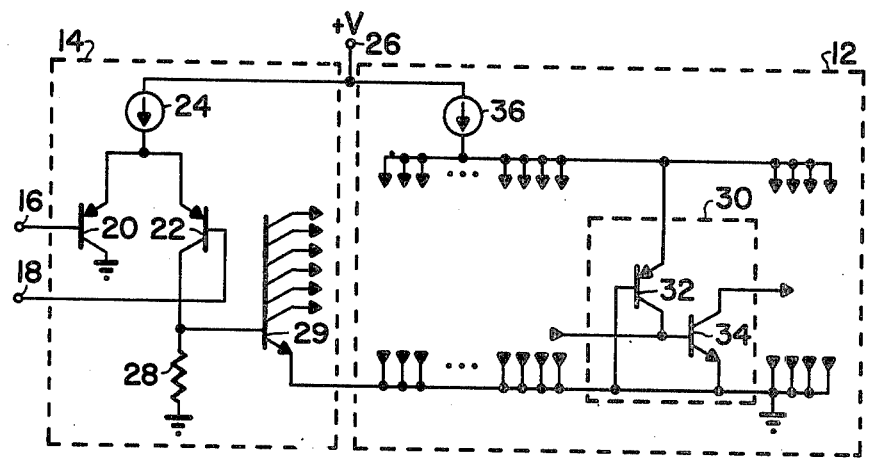
FIG. 2 is a circuit diagram of a preferred embodiment of the present invention.

The interface 14 of FIG. 1 is shown schematically in FIG. 2. A pair of input terminals 16 and 18 are connected to the base of two PNP differential transistors 20 and 22. A current source 24 provides current to the common emitters of differential transistors 20 and 22 from a positive D.C. supply voltage (not shown) at terminal 26. The collector of transistor 20 is connected to ground or a reference voltage potential. The collector of transistor 22 is connected to resistor 28 which in turn is connected to ground. Also, the collector of transistor 22 is connected to the base of an individual I²L NPN output transistor 29. The NPN I²L output transistor 29 is a standard I²L device which lies within the isolated I²L circuitry on the integrated circuit and is identical to other I²L gates except that it lacks the normal lateral PNP current injector transistor. The I²L region as indicated by block 12 also contains the rest of the I²L circuitry including a typical I²L gate of gate 30 which comprises lateral PNP current injector transistor 32 and NPN output transistor 34. Current source 36 provides injection current for the I²L devices. The other side of current source 36 is connected to a positive voltage at terminal 26.

In operation an information carrying input signal and a reference voltage are provided at terminals 16 and 18 by circuitry not shown in FIG. 2. That is a reference voltage is selected by the user to be within the range of the upper voltage level and lower voltage level of the input signal at the other terminal. The selection of which terminal, 16 or 18, receives the information carrying input signal and which receives the reference voltage is left to the user. The selection determines the polarity of the logic signal as it appears at the collectors of NPN output transistor 29, thus giving the user the choice of an inverting or non-inverting interface circuit. Current source 24 provides a constant current which is passed through either transistor 20 or transistor 22, depending on the relative voltages appearing at the bases of the respective transistors as occurs in differential transistor pairs and well known to anyone skilled in the art. The magnitude of current from current source 24 is chosen to provide adequate base drive to NPN output transistor 29 to insure that the collectors are pulled low when transistor 22 is conducting. Resistor 28 removes base charge from NPN output transistor 29 when transistor 22 is not conducting.

The collectors of NPN output transistor 29 are in turn connected as normal signal lines within the I²L circuitry. Since the NPN transistor 29 is a normal I²L device, it can be centrally located physically within the I²L circuitry to provide easy access to other I²L gates. This is particularly advantageous both from a topological perspective for circuit layout and from a circuit performance perspective when, for example, the input signal would be a clocking signal for a plurality of I²L flip-flops.

The circuit diagram of FIG. 2 indicates several advantages of the present invention in that a plurality of collectors can be included in NPN output transistor 29, in fact more than are normally allowed with I²L device gates since the base drive into NPN output transistor 29 is controlled by a separate current source 24. Thus, it is possible to provide many more collectors than are normally allowed with I²L gates and still insure reliable circuit operation. Moreover, since the I²L output transistor 29 does not have an integral PNP lateral current injector transistor as for example, transistor 32 of I²L gate 30, the beta of NPN output transistor 29 is increased by at least a factor of two. Thus, the current required to drive the base of transistor 29 is at most only a half of what was normally required for I²L output transistors thereby saving power supply current drain required by the interface circuit. Thus, the interface circuit operates with significantly less power than prior art interface circuits, a fact which becomes very important in circuits which have a lot of interface signals from other types of logic families. Also, PNP differential transistor pair 20 and 22 operate in most applications in either the active region or the cutoff region and do not go into saturation to thereby provide minimum propogation delay from the input terminals 16 and 18 to the inputs to the I²L circuitry appearing at the collectors of NPN output transistor 29. Also, as can be seen in FIG. 2, the interface circuit itself is fairly simple, comprised of a current source, a PNP differential pair, a resistor, and a I²L output transistor all of which require a minimal amount of semiconductor substrate area.

The user is able to provide a varying reference voltage, for example one which tracks the information carrying signal voltage range over temperature. Also, a true differential input could be applied to input terminals 16 and 18, or a single reference voltage could be used with a plurality of interface circuits of the type disclosed. Finally, the reference voltage could be formed in the integrated circuit itself, thereby resulting in a single input terminal.

Figure 3:
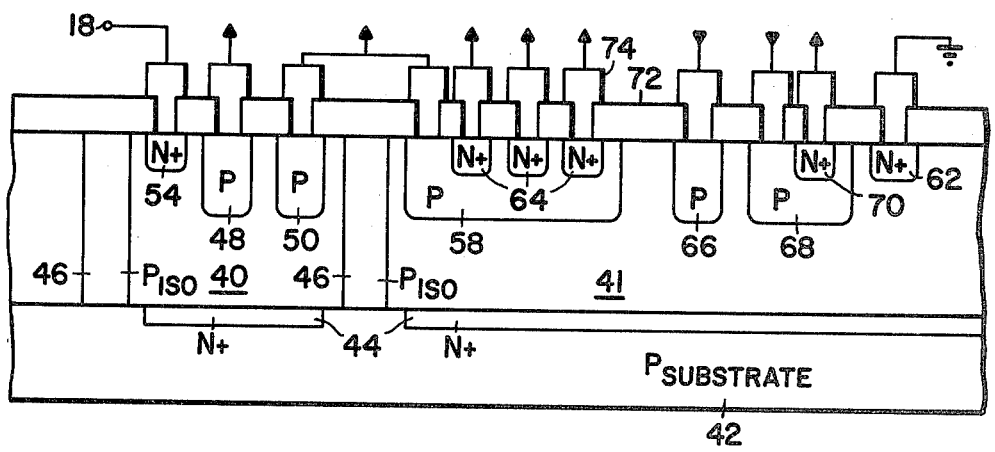
FIG. 3 is a cross-sectional view of an integrated circuit showing a structure which could be used to realize a preferred embodiment.

FIG. 3 is a cross-sectional view of an integrated circuit showing a structure which might be used for realizing the preferred embodiment. An N-type epitaxial (epi) layer shown as regions 40 and 41 is grown on top of P-type substrate 42 after buried layers 44 have been diffused into the substrate. Next, isolation regions 46 are diffused into the epitaxial layer to isolate the epitaxial layer into separate regions 40 and 41. Differential PNP transistor 22 of FIG. 2 is realized by P diffusions 48 and 50 located in the isolated epi region 40. P region 48 is the emitter of transistor 22 and is also connected to the emitter of the other differential transistor 20 (not shown) and also connected to current source 24 (not shown). N+ region 54 is a base contact for the lateral PNP transistor and is connected to input terminal 18 of the interface circuit. The collector, P diffusion 50, is connected to the base of NPN I²L output transistor 29 shown as P region 58. The emitter of NPN output transistor 29, which is the isolated N epi region 41, is connected to ground through the N+ diffusion 62 which is also the common ground terminal for the I²L circuitry. The collector outputs of NPN output transistor 29 are shown as N+ regions 64. Although only three collectors have been shown in FIG. 3, it will be understood by those skilled in the art that a multiplicity of collectors can be situated in the base region 58. It is also possible to separate NPN output transistor 29 into two separate base regions, each having a plurality of collectors. Note that the NPN output transistor does not have any integral lateral PNP injection current transistor as is required with standard I²L gates.

By way of comparison, a standard I²L gate is shown in FIG. 3 as P diffusions 66 and 68 wherein P diffusion 66 is the emitter of the lateral PNP transistor and is connected to the injection current source for the I²L circuitry. The N epi region 41 then forms a base region for the lateral PNP transistor and an emitter region for the NPN output transistor and P region 68 is both the collector for the lateral PNP transistor and also the base for the NPN output transistor of standard I²L devices. Finally, N+ region 70 is a collector output of a standard I²L gate. To complete the construction, an oxide layer 72 is formed over the silicon wafer and metallization areas 74 provide contact between devices on integrated circuit chip. Note from FIG. 3 the simplicity of the differential input interface circuitry and the ability of the NPN I²L output transistor 29 of the interface circuit to be placed within the I²L isolated region on the semiconductor substrate thus making it an integral part of the I²L circuitry.

Although the embodiment shown operates from a positive supply voltage and a ground potential, it would be possible to also operate the interface circuitry and the I²L circuitry with a negative power supply by connecting ground connections of FIG. 2 to a negative supply and connecting the current sources of FIG. 2 either to a ground or to a positive voltage. This arrangement will allow interfacing directly with logic families such as PMOS which have traditionally used negative voltage levels on their outputs. Thus, by judicious choice of supply voltages for the circuit, it is possible for this interface circuit to operate with almost any known logic family directly.

While the invention has been particularly shown and described with reference to a preferred embodiment thereof it will be understood by those skilled in the art that various changes may be made therein without departing from the teachings of the invention. Therefore, it is intended in the appended claims to cover all such equivalent variations as come within the spirit and scope of the invention.

What is claimed is:

1. An interface circuit for receiving external input signals for subsequent use by I²L circuitry, comprising:
   (a) a current source for providing a current;
   (b) a differential transistor pair, each transistor being of a first conductivity type, each transistor of said differential transistor pair having a first, a second and a third electrode, each of said electrodes being of the same type as the corresponding electrode of the other transistor of said differential transistor pair, one of each of said same type electrodes of each of said transistors of said differential transistor pair being connected in common to said current source, another of said same type electrodes of each of said transistors of said differential transistor pair being connected to the external input signals, said differential transistor pair having an output thereof derived from still another one of said electrodes of the same type, said output of said differential transistor pair being for selectively supplying the current provided by said current source; and
   (c) a multiple-collector output transistor of a second conductivity type opposite to said first conductivity type disposed in said I²L circuitry and having an input electrode coupled to said output of said differential transistor pair and being responsive to said selectively supplied current for providing I²L compatible signal levels at a plurality of collector electrodes of said multiple-collector output transistor for subsequent use by said I²L circuitry and in response to said external input signals.

2. A digital logic to I²L interface circuit comprising:
   (a) constant current means supplying a constant current at its output;
   (b) a PNP differential transistor pair having common emitter electrodes coupled to said output of said constant current means, separate first and second base electrodes for receiving logic signals from digital logic at said first base electrode and a reference signal at said second base electrode, and an output electrode, said output electrode being for selectively supplying said constant current supplied by said constant current means; and
   (c) at least one NPN multiple-collector output transistor having a base electrode coupled to said output electrode of said PNP differential transistor pair and being responsive to said selectively supplied current, and having a plurality of collector electrodes providing I²L compatible signal levels in response to said logic signals from said digital logic.

3. A digital logic to I²L interface circuit as set forth in claim 2 wherein said interface circuit is situated in an integrated circuit with I²L circuitry.

4. An interface circuit integrated on a semiconductor substrate with I²L circuitry and having dual input terminals comprising:
   (a) current means supplying a predetermined current at its output;
   (b) differential comparator means coupled to said current means, having an output and having dual inputs coupled to the dual input terminals for differentially comparing voltage signals applied thereto; and
   (c) at least one multiple-collector output transistor having a plurality of collector electrodes and having a base electrode directly coupled to said output of said differential comparator for providing I²L compatible signal levels at each of said plurality of collector electrodes of said at least one output transistor in response to voltage signals appearing at said dual input terminals.

5. A method for interfacing external input signals with I²L circuitry which comprises:
   (a) differentially sensing a dual input signal at dual input terminals for determining if one of said input terminals is at a more positive voltage potential than the other of said dual input terminals; and
   (b) forcing at least one multiple-collector output transistor into either a conducting or non-conducting state as determined by said differential sensing for providing I²L compatible signal levels to I²L circuitry in response to said dual input signal.

6. A method for transferring digital logic information into I²L circuitry which comprises:
   (a) comparing digital logic information voltage levels to a reference voltage to provide an output current which is either greater than zero or equal essentially to zero as determined by said comparison; and
   (b) applying said output current to the base of at least one multiple-collector output transistor for placing said transistor into a conducting or non-conducting state in response to said digital logic information such that said transistor is in the conducting state when said output current is greater than zero and in the non-conducting state when said output current is equal essentially to zero, said transistor having output signal levels compatible with I²L circuitry.

7. An integrated circuit, including an interface circuit, comprising:
   (a) a plurality of I²L gates, each of said plurality of I²L gates having at least one signal input terminal and an output terminal, said plurality of I²L gates being disposed on a substrate;
   (b) an interface transistor of a first conductivity type and having a plurality of collector electrodes, a base and an emitter electrode, said interface transistor being disposed on said substrate; and
   (c) differential amplifier means for receiving an external data signal and for providing base current to said base of said interface transistor responsive to said data signal, said differential amplifier means including a pair of transistors disposed on said substrate, each of said pair of transistors including a base electrode and being of a second conductivity type opposite to said first conductivity type, said plurality of collector electrodes of said interface transistor being coupled to at least one of said input terminals of said plurality of I²L gates.

8. An integrated circuit as set forth in claim 7 wherein each transistor of said differential amplifier means is coupled to an external input signal at their respective base electrodes.

* * * * *